US012713974B2

(12) United States Patent
Chang et al.

(10) Patent No.: US 12,713,974 B2
(45) Date of Patent: Aug. 18, 2026

(54) SEMICONDUCTOR PACKAGE INCLUDING SURFACE WITH REDUCED VISUAL VARIATION

(71) Applicant: Samsung Electronics Co., Ltd., Suwon-si (KR)

(72) Inventors: Wongi Chang, Hwaseong-si (KR); Dongkwan Kim, Hwaseong-si (KR); Jihan Ko, Hwaseong-si (KR); Jungseok Ryu, Asan-si (KR); Youngmin Lee, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 634 days.

(21) Appl. No.: 17/724,568

(22) Filed: Apr. 20, 2022

(65) Prior Publication Data

US 2023/0082912 A1 Mar. 16, 2023

(30) Foreign Application Priority Data

Sep. 15, 2021 (KR) ........................ 10-2021-0122898

(51) Int. Cl.
*H10W 90/00* (2026.01)
*H10W 72/30* (2026.01)
(Continued)

(52) U.S. Cl.
CPC ...... *H10W 90/00* (2026.01); *H10W 72/07353* (2026.01); *H10W 72/331* (2026.01); (Continued)

(58) Field of Classification Search
CPC ........... H01L 24/48; H01L 2224/16227; H01L 2224/32059; H01L 2224/32145; H01L 2224/48228; H01L 2224/73265; H01L 25/0652; H01L 25/0655; H01L 23/49816; H01L 24/16; H01L 24/32; H01L 24/73; H01L 2224/16238; H01L 2224/32058; H01L 2224/3207; H01L 2224/32225; H01L 2224/73204; H01L 2224/73215; H01L 2924/1011; H01L 2924/10156;
(Continued)

(56) References Cited

U.S. PATENT DOCUMENTS 6,049,124 A * 4/2000 Raiser ................ H01L 29/0657 257/E29.022
7,037,753 B2 5/2006 Brodsky et al.
(Continued)

FOREIGN PATENT DOCUMENTS

KR 20000074806 A 12/2000
KR 20170029849 A 3/2017

*Primary Examiner* — Duy T Nguyen
(74) *Attorney, Agent, or Firm* — Wolf, Greenfield & Sacks, P.C.

(57) ABSTRACT

A semiconductor package includes a circuit board including a wiring structure, first and second semiconductor chips disposed on the circuit board and connected to the wiring structure, a dummy chip disposed on the circuit board and positioned between the first and second semiconductor chips, and a molded member disposed on the circuit board and surrounding the first and second semiconductor chips and the dummy chip. The dummy chip may include a rounded edge between an upper surface and a side surface.

9 Claims, 15 Drawing Sheets

I-I'

(51) Int. Cl.
*H10W 74/00* (2026.01)
*H10W 72/00* (2026.01)
*H10W 74/15* (2026.01)

(52) U.S. Cl.
CPC ........ *H10W 72/334* (2026.01); *H10W 72/865* (2026.01); *H10W 72/884* (2026.01); *H10W 74/00* (2026.01); *H10W 74/15* (2026.01); *H10W 90/701* (2026.01); *H10W 90/724* (2026.01); *H10W 90/732* (2026.01); *H10W 90/734* (2026.01); *H10W 90/754* (2026.01)

(58) Field of Classification Search
CPC . H01L 2924/10157; H01L 2924/10158; H01L 2924/10161; H01L 2924/182; H01L 2924/3511; H01L 23/16; H01L 23/562; H01L 24/13; H01L 24/49; H01L 24/85; H01L 2224/16225; H01L 2224/48091; H01L 2224/48227; H01L 2224/49175; H01L 2224/8592; H01L 2924/00014; H01L 2924/181
USPC .......................................................... 257/690
See application file for complete search history.

(56) References Cited

U.S. PATENT DOCUMENTS 9,202,716 B2 12/2015 Park et al.
10,297,571 B2 * 5/2019 Ozawa ................ H01L 23/3135
2003/0230800 A1 12/2003 Akai
2004/0026768 A1 * 2/2004 Taar ..................... H10D 62/117 257/E29.022
2007/0007639 A1 * 1/2007 Fukazawa ........... H01L 25/0657 438/109
2014/0354396 A1 * 12/2014 Nukaga ................ H01C 17/242 29/610.1
2015/0357517 A1 * 12/2015 Chen .................... H10H 20/819 257/98
2016/0322330 A1 * 11/2016 Lin ..................... H01L 25/0652
2017/0069633 A1 3/2017 Kim et al.
2018/0175011 A1 * 6/2018 Sung ..................... H01L 21/565
2020/0365479 A1 11/2020 Chiu et al.
2021/0066254 A1 3/2021 Yu et al.
2021/0098328 A1 * 4/2021 Chu ...................... H01L 23/481
2021/0151388 A1 5/2021 Choi et al.

* cited by examiner

SEMICONDUCTOR PACKAGE INCLUDING SURFACE WITH REDUCED VISUAL VARIATION

CROSS-REFERENCE TO RELATED APPLICATION(S)

This application claims the benefit under 35 USC § 119(a) of Korean Patent Application No. 10-2021-0122898 filed on Sep. 15, 2021 in the Korean Intellectual Property Office, the disclosure of which is incorporated herein by reference in its entirety.

BACKGROUND

The present inventive concept relates to a semiconductor package.

With the development of the electronic industry, there is an increasing demand for high-functionality, high-speed, and miniaturization of electronic components. According to this trend, a package is manufactured by mounting a plurality of semiconductor chips on a single interposer or package substrate. Due to the difference in characteristics between individual components constituting the semiconductor package, a visual variation of the surface of the semiconductor package may occur. There is a need for a technology capable of reducing the visual variation on the surface of a semiconductor package.

SUMMARY

Example embodiments provide a semiconductor package in which the visual variation of the surface may be reduced.

According to example embodiments, a semiconductor package includes a circuit board including a wiring structure; first and second semiconductor chips on the circuit board and connected to the wiring structure; a dummy chip on the circuit board, positioned between the first and second semiconductor chips, and having a rounded edge between an upper surface and a side surface thereof; and a molded member on the circuit board and surrounding the first and second semiconductor chips and the dummy chip.

According to example embodiments, a semiconductor package includes a circuit board including a wiring structure; a semiconductor chip on the circuit board and connected to the wiring structure; a dummy chip on the circuit board and having an inclined surface between an upper surface and a side surface thereof; and a molded member on the circuit board and surrounding the semiconductor chip and the dummy chip.

According to example embodiments, a semiconductor package includes a circuit board including a wiring structure; a semiconductor chip on the circuit board and connected to the wiring structure; a dummy chip on the circuit board and including an upper connection portion connecting an upper surface of the dummy chip and side surfaces of the dummy chip and a lower connection portion connecting the side surfaces of the dummy chip and a lower surface of the dummy chip, one side surface of the side surfaces facing one side surface of the semiconductor chip; and a molded member on the circuit board and surrounding the semiconductor chip and the dummy chip.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
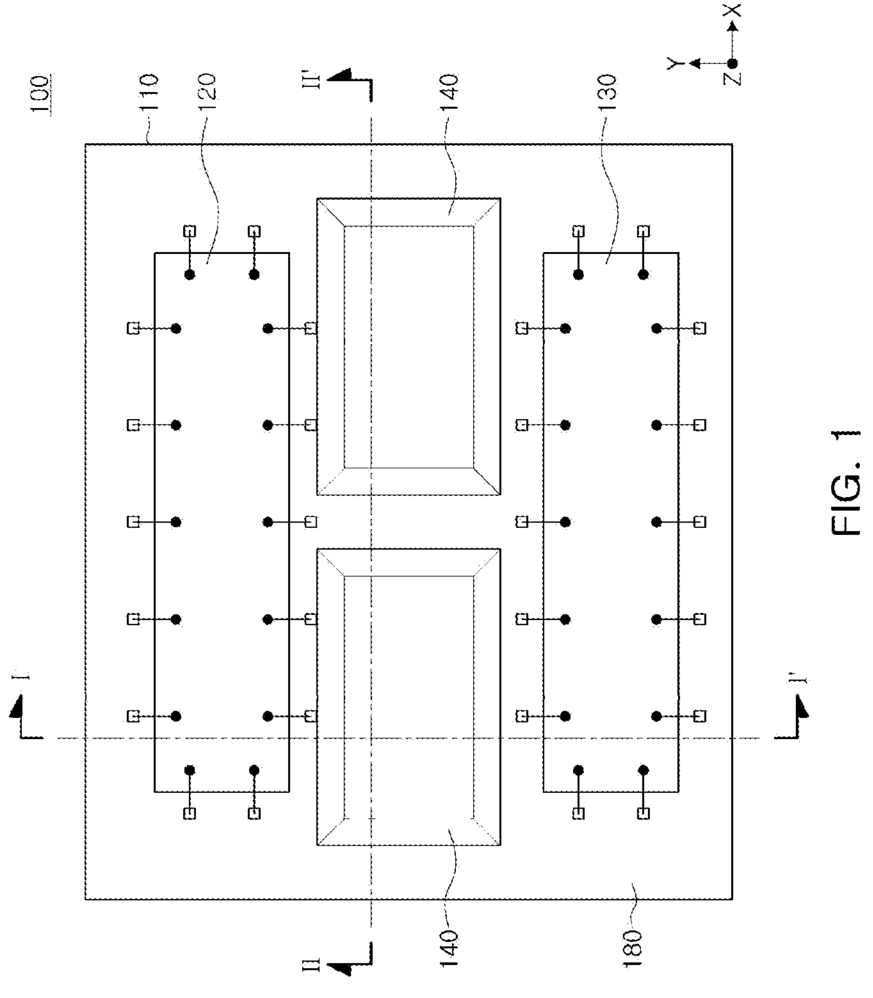
FIG. 1 is a plan view of a semiconductor package according to example embodiments.
Figure 2A:
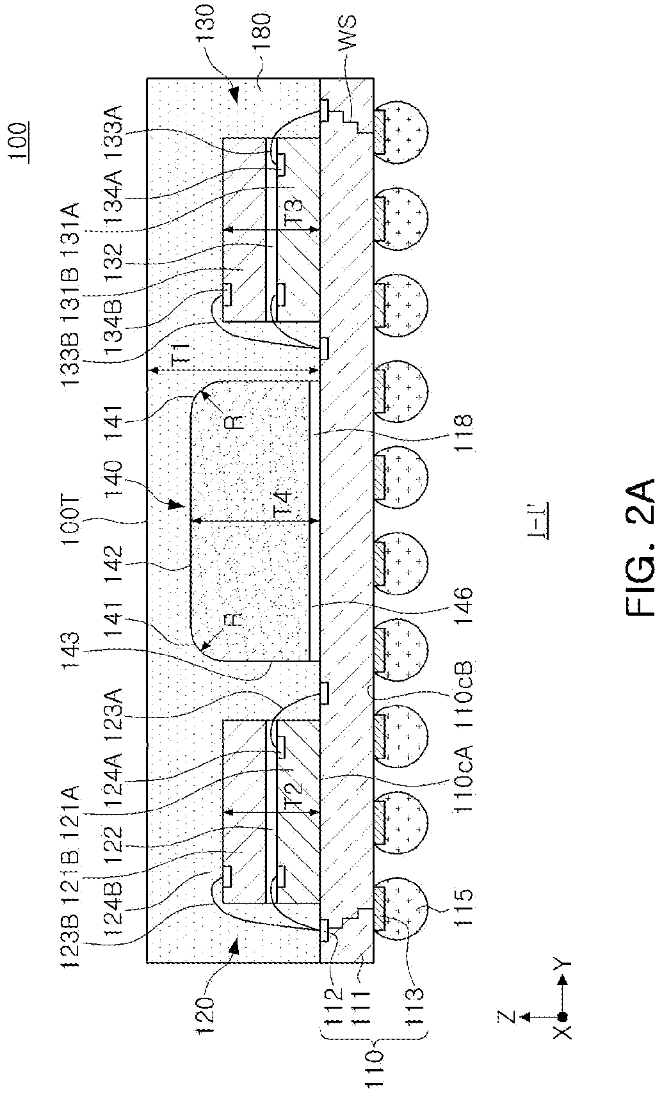
FIG. 2A is a cross-sectional view of the semiconductor package of FIG. 1 taken along line I-I'.

FIG. 1 is a plan view of a semiconductor package according to an example embodiment. FIG. 2A is a cross-sectional view of the semiconductor package illustrated in FIG. 1 taken along line I-I', and FIG. 2B is a cross-sectional view of the semiconductor package illustrated in FIG. 1 taken along line II-II'.

Figure 2B:
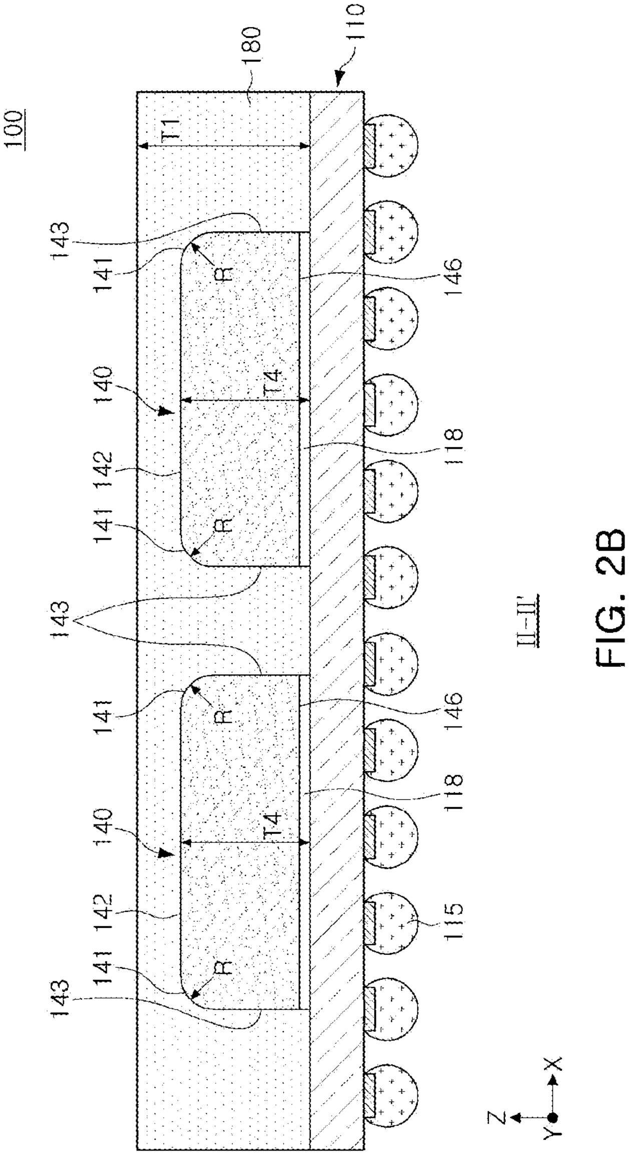
FIG. 2B is a cross-sectional view of the semiconductor package of FIG. 1 taken along line II-II'.

Referring to FIGS. 1, 2A and 2B, a semiconductor package 100 according to an example embodiment may include a circuit board 110 having first and second surfaces opposing each other, a first semiconductor chip 120 and a second semiconductor chip 130 disposed on a first surface 110*c*A of the circuit board 110, a dummy chip 140 disposed on the first surface 110*c*A of the circuit board 110 and disposed between the first and second semiconductor chips 120 and 130, and a molded member or molding member 180 disposed on the first surface 110*c*A of the circuit board 110 and surrounding the first and second semiconductor chips 120 and 130 and the dummy chip 140.

The circuit board 110 employed in this embodiment may include a wiring structure WS disposed on or in a substrate 111, and a plurality of upper pads 112 and a plurality of lower pads 113 disposed on the first and second surfaces 110*c*A and 110*c*B, respectively, and connected by the wiring structure WS. In some embodiments, the circuit board 110 may be a printed circuit board (PCB). For example, the substrate 111 may be or include a thermosetting resin such as an epoxy resin, a thermoplastic resin such as polyimide, or a photosensitive insulating layer. In another embodiment, the circuit board 110 may be an interposer, and the substrate 111 may be a silicon substrate.

External terminals 115 may be provided on the plurality of lower pads 113 positioned on the second surface 110*c*B of the circuit board 110. For example, the external terminal 115 may include at least one of tin (Sn), lead (Pb), nickel (Ni), gold (Au), silver (Ag), copper (Cu), or bismuth (Bi), or alloys thereof. Although FIGS. 2A and 2B illustrate a case in which the external terminal 115 is a solder ball, other types of connection terminals may also be used.

The first and second semiconductor chips 120 and 130, the dummy chip 140, and the molded member 180 may be provided on the first surface 110*c*A of the circuit board 110.

In some embodiments, the first and second semiconductor chips 120 and 130 may include a memory chip such as DRAM, SRAM, flash, PRAM, ReRAM, FeRAM, or MRAM. The first and second semiconductor chips 120 and 130 may be electrically connected to the circuit board 110 through the upper pads 112 and bonding wires 123A, 123B, 133A, and 133B. The circuit board 110 may be electrically connected to an external device such as an external memory controller through the external terminal 115.

In another embodiment, the first semiconductor chip 120 may include a logic chip. For example, the first semiconductor chip 120 may include a microprocessor or a controller including a logic device. The second semiconductor chip 130 may include a memory chip such as DRAM, SRAM, flash, PRAM, ReRAM, FeRAM, or MRAM. For example, the second semiconductor chip 130 may be a high-band memory (HBD) chip formed of a memory stack connected in a TSV structure.

The first semiconductor chip 120 may include a plurality of stacked chips, for example, a first chip 121A and a second chip 121B. The first chip 121A and the second chip 121B may be coupled to each other through an adhesive layer 122. The first chip 121A may also be coupled to the substrate 110 through an adhesive layer. A first bonding wire 123A that electrically connects the first chip 121A to the upper pad 112 may be drawn out while penetrating through the adhesive layer 122 from a first pad 124A on the first chip 121A and may then be connected to the upper pad 112. A second bonding wire 123B electrically connecting the second chip 121B to the upper pad 112 may also be connected to a second pad 124B on the second chip 121B.

Similarly, the second semiconductor chip 130 may include a plurality of stacked chips, for example, a first chip 131A and a second chip 131B. The first chip 131A and the second chip 131B may be coupled to each other through an adhesive layer 132. The first chip 131A may also be coupled to the substrate 110 through an adhesive layer. The first bonding wire 133A electrically connecting the first chip 131A to the upper pad 112 may be drawn out while penetrating through the adhesive layer 132 from a first pad 134A on the first chip 131A, and may then be connected to the upper pad 112. The second bonding wire 133B electrically connecting the second chip 131B to the upper pad 112 may also be connected to a second pad 134B on the second chip 131B.

The dummy chip 140 may be disposed on the first surface 110*c*A of the circuit board 110. For example, the dummy chip 140 may be disposed between the first and second semiconductor chips 120 and 130. The dummy chip 140 may have opposite sides facing one side of each of the first and second semiconductor chips 120 and 130, respectively. In a package in which a plurality of semiconductor chips are disposed on a single substrate or interposer, a warpage phenomenon in which the semiconductor package is warped may occur due to a difference in coefficient of thermal expansion between individual components constituting the semiconductor package. The semiconductor package 100 according to the present embodiment includes the dummy chip 140 between the semiconductor chips to control the thermal expansion coefficient of the semiconductor package 100, thereby reducing the warpage problem of the semiconductor package 100. For example, the dummy chip 140 may have a coefficient of thermal expansion lower than that of the first and second semiconductor chips 120 and 130 and the molded member 180.

As illustrated in FIG. 1, two dummy chips 140 may be disposed between the first semiconductor chip 120 and the second semiconductor chip 130, but the configuration is not limited thereto. For example, one dummy chip 140 or more than two dummy chips 140 may be employed in various embodiments. The positions, shapes, numbers, and coefficients of thermal expansion of the first and second semiconductor chips 120 and 130 and the dummy chips 140 may be determined in consideration of the degree of integration, size, and coefficient of thermal expansion of the semiconductor package 100.

Referring to FIGS. 2A and 2B, the dummy chip 140 may be bonded to the circuit board 110 by a bonding layer 118. The bonding layer 118 may be formed of a non-conductive film (NCF), an anisotropic conductive film (ACF), a UV-sensitive film, an instant adhesive, a thermosetting adhesive, a laser curable adhesive, an ultrasonic curable adhesive, or a nonconductive paste (NCP). The dummy chip 140 may include side surfaces 143 facing one side of the first semiconductor chip 120 and one side of the second semiconductor chip 130. A space between one side surface 143 of the dummy chip and the first semiconductor chip 120 and a space between the other (opposite) side surface 143 of the dummy chip and the second semiconductor chip 130 may have the same or different widths.

The molded member 180 may be disposed on the first surface 110*c*A of the circuit board 110 to surround the first and second semiconductor chips 120 and 130. The molded member 180 may include an insulating polymer material. For example, the molded member 180 may include a resin such as Epoxy Molding Compound (EMC).

Referring to FIGS. 2A and 2B, a mounting height T4 of the dummy chip 140 may be relatively greater than a mounting height T2 of the first semiconductor chip 120 and a mounting height T3 of the second semiconductor chip 130. For example, an upper surface 142 of the dummy chip 140 may be disposed on a vertical level higher than the upper surfaces of the first and second semiconductor chips 120 and 130. In a semiconductor package having a micro size, there may be a limit to increasing the X-direction length or Y-direction width of the dummy chip 140. Therefore, instead of increasing the X-direction length and Y-direction width of the dummy chip 140, the Z-direction height may be increased to secure the occupancy of the dummy chip 140, thereby controlling the thermal expansion coefficient of the semiconductor package 100.

For example, the dummy chip 140 may have the mounting height T4 of about 1.05 times to about 1.30 times greater than the mounting heights T2 and T3 of the first and second semiconductor chips 120 and 130. In an example embodiment, the mounting heights T2 and T3 of the first and second semiconductor chips 120 and 130 may be from about 150 μm to about 170 μm, and the mounting height T4 of the dummy chip 140 may be from about 160 μm to about 180 μm. Also, the dummy chip 140 may have a mounting height of about 0.5 to about 0.8 times a height T1 of the molded member 180. In an example embodiment, a distance between the upper surface 142 of the dummy chip and an upper surface 100T of the semiconductor package or the molded member 180 may be about 130 μm to about 170 μm.

If the mounting height T4 of the dummy chip 140 does not satisfy the above range, the effect of controlling the coefficient of thermal expansion and reducing warpage may be insufficient. If the mounting height T4 of the dummy chip 140 exceeds the above range, there may be a limitation in miniaturization of the semiconductor package 100. In the example embodiment of FIG. 2A, the mounting heights of the first semiconductor chip 120 and the second semiconductor chip 130 are illustrated as being the same vertical level, but the mounting heights of the first semiconductor chip 120 and the second semiconductor chip 130 may be different in other embodiments.

As described above, as the mounting height T4 of the dummy chip 140 increases, the upper surface 142 of the dummy chip may become closer to the upper surface 100T of the semiconductor package. Therefore, there is a problem in that a visual variation occurs between a portion on which the first and second semiconductor chips 120 and 130 are mounted and a portion on which the dummy chip 140 is mounted, in the appearance of the semiconductor package 100. In detail, a large visual variation from other regions occurs at the edge of the dummy chip 140, thereby damaging the appearance of the semiconductor package 100. Accordingly, to improve the appearance of the semiconductor package 100, a method for reducing the visual variation between the edges of the dummy chip 140 and other regions is required. By controlling the shape and thickness of the edges of the dummy chip 140, the difference in transmittance and reflectance between the edges of the dummy chip 140 and other regions may be reduced, thereby preventing the non-uniformity problem of the appearance of the semiconductor package 100.

As illustrated in FIGS. 2A and 2B, by rounding the edges of the dummy chip 140 in the horizontal direction (X-Y directions), a rounded inclined surface may be included as an upper connection portion or upper transition portion 141 between the upper surface 142 and the side surface 143 of the dummy chip 140. The connection portion 141 may include a rounded inclined surface. The connection portion 141 may include a rounded convex surface. Accordingly, the visual variation problem at the edge of the dummy chip 140 may be reduced. For example, an edge connecting the upper surface 142 and the side surface 143 may be rounded in the horizontal direction (X-Y directions) to form the upper connection portion 141. In the cross section of FIGS. 2A and 2B, the upper connection portion 141 of the dummy chip 140 may have a radius of curvature R of about 15 μm to about 90 μm. If the radius of curvature R of the upper connection portion 141 is smaller than the above range, the rate at which the edges of the dummy chip 140 are rounded is relatively low, and thus, the effect of reducing the visual variation of the appearance of the semiconductor package may be insufficient. If the radius of curvature R of the upper connection portion 141 is greater than the above range, the rate at which the edges of the dummy chip 140 are removed increases, and thus, it may be difficult to control the coefficient of thermal expansion of the semiconductor package. The radii of curvatures of the inclined surfaces formed by rounding respective edges of the dummy chip 140 may be the same or different from each other.

Referring to FIG. 2A, the Y-direction width of the upper surface 142 of the dummy chip 140 may be shorter than the Y-direction width of the lower surface 146 of the dummy chip 140. Also, referring to FIG. 2B, the X-direction length of the upper surface 142 of the dummy chip 140 may be shorter than the X-direction length of the lower surface 146 of the dummy chip 140. For example, the Y-direction width of the upper surface 142 of the dummy chip 140 may be about 0.3 to 0.9 times the Y-direction width of the lower surface 146 of the dummy chip 140. The X-direction length of the upper surface 142 of the dummy chip 140 may be about 0.4 about 0.95 es the X-direction length of the lower surface 146 of the dummy chip 140. If the width and length of the upper surface 142 of the dummy chip are lower than the above ratios, the rate at which the edges of the dummy chip 140 are removed increases, and thus, it may be difficult to control the coefficient of thermal expansion of the semiconductor package. If the width and length of the upper surface 142 of the dummy chip exceed the above ratios, the rate at which the edges of the dummy chip 140 are rounded is low, and thus, the effect of reducing the visual variation of the appearance of the semiconductor package may be insufficient.

Referring to FIGS. 2A and 2B, the dummy chip 140 having the upper connection portion 141 of the inclined surface is convex upward or outward as illustrated, but the present inventive concept is not limited thereto. The dummy chip 140 may also include a downwardly or inwardly convex (e.g., concave) inclined surface.

As described above, by including the dummy chip having trimmed or rounded edges, the effect of reducing the visual variation of the appearance of the semiconductor package without restrictions such as the viscosity of the molded member, the filler content, the surface roughness of the release film for the semiconductor package mold, the thickness, and the like may be exhibited. In addition, since there are relatively low restrictions on the mounting height of the dummy chip, the warpage problem may be reduced by controlling the thermal expansion coefficient of the semiconductor package. In addition, as a method of trimming or rounding the edge of the dummy chip, an existing blade saw, dicing blade, or the like may be used, and thus, an additional process or cost is not required. For example, the manufacturing of the semiconductor package according to the present embodiment may maintain process efficiency while resolving material restrictions.

Figure 3:
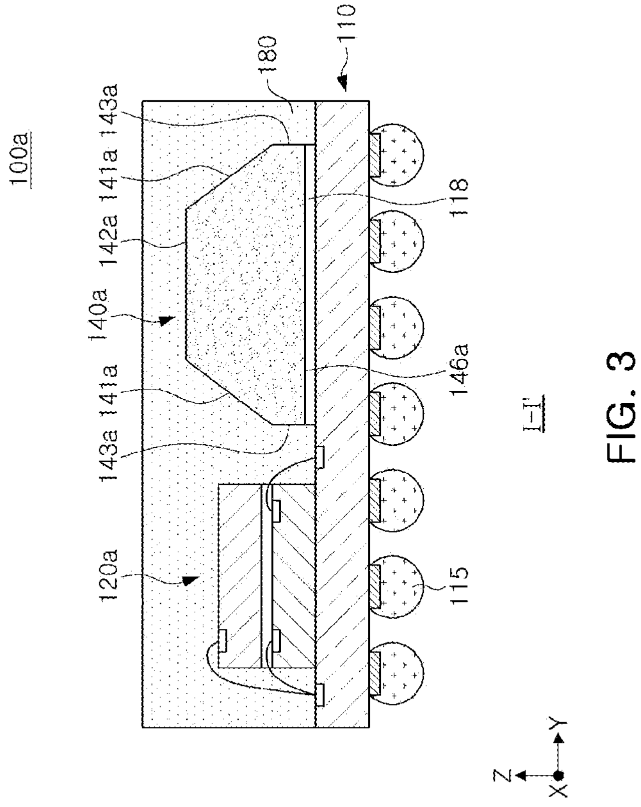
FIG. 3 is a cross-sectional view illustrating a modified example of the semiconductor package illustrated in FIGS. 2A and 2B.
Figure 4:
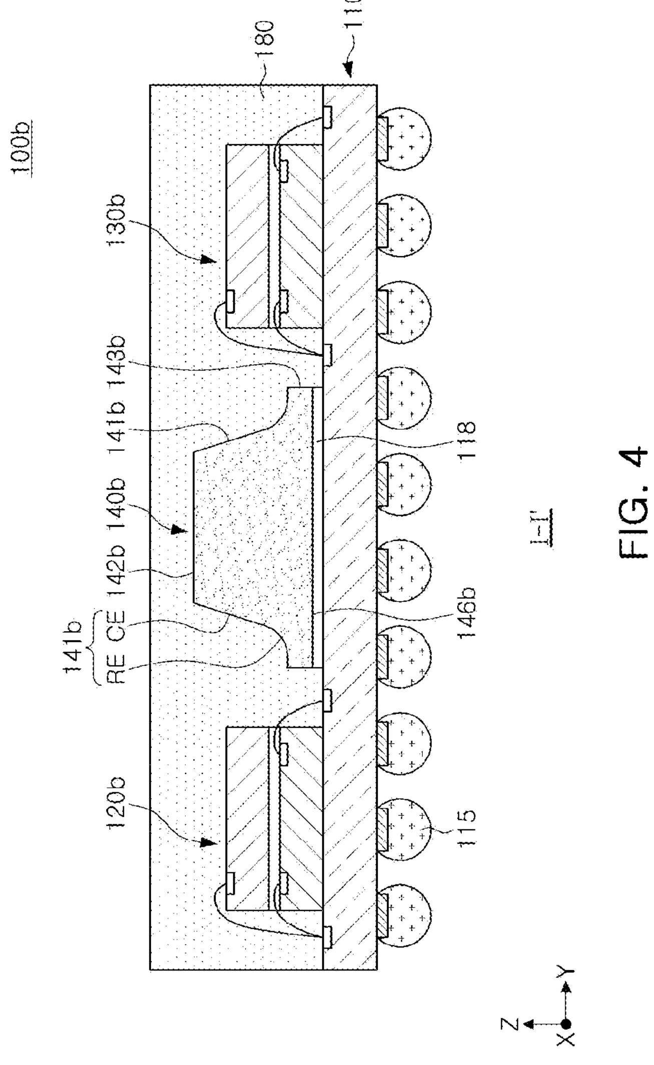
FIG. 4 is a cross-sectional view illustrating a modified example of the semiconductor package illustrated in FIGS. 2A and 2B.
Figure 5:
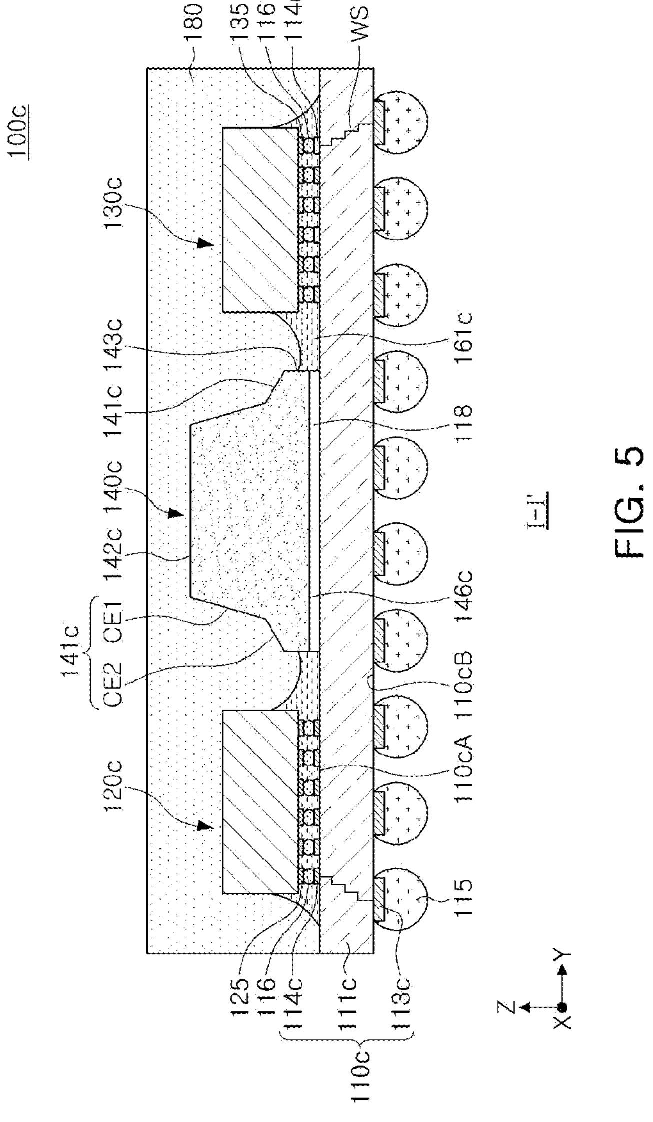
FIG. 5 is a cross-sectional view illustrating a modified example of the semiconductor package illustrated in FIGS. 2A and 2B.

FIGS. 3 to 5 are cross-sectional views illustrating modified examples of the semiconductor package illustrated in FIGS. 2A and 2B. Semiconductor packages in example embodiments of FIGS. 3 to 5 are different from the semiconductor package 100 illustrated in FIGS. 1 to 2B in the shape of the dummy chip, the arrangement of the chips, and the connection method between the chip and the substrate. For descriptions of components of example embodiments of FIGS. 3 to 5, the descriptions of the same or similar components of the semiconductor package 100 illustrated in FIGS. 1 to 2B may be omitted in the interest of brevity.

In an example embodiment of FIG. 3, a semiconductor package 100*a* may include a semiconductor chip 120*a* and a dummy chip 140*a*. The example embodiment of FIG. 3 is different from the dummy chip 140 illustrated in FIGS. 2A and 2B in that only one side of the dummy chip 140*a* faces one side of the semiconductor chip 120*a*. For example, the dummy chip may be disposed between semiconductor chips or may be disposed to face one semiconductor chip. In another example, the semiconductor chips may be disposed between a plurality of dummy chips.

Also, referring to FIG. 3, the dummy chip 140*a* is different from the dummy chip 140 illustrated in FIGS. 2A and 2B in that it has an upper connection portion or transition portion 141*a* of a chamfered inclined surface. The dummy chip 140*a* illustrated in FIG. 3 may include an upper surface 142*a*, a side surface 143*a*, and an inclined surface connecting the upper surface 142*a* and the side surface 143*a*. In the present embodiment, since the thickness of the dummy chip 140*a* in the upper connection portion 141*a* is relatively small compared to a maximum mounting height of the dummy chip, the reflection of the dummy chip 140*a* through the upper connection portion 141*a* may be reduced. Accordingly, in the appearance of the semiconductor package 100*a*, a problem of visual variation between the dummy chip 140*a* and the semiconductor chip 120*a* may be reduced.

Referring to FIG. 3, the width of the upper surface 142*a* of the dummy chip may have a size of about 0.7 to 0.95 times the width of the lower surface 146*a*. If the width of the upper surface 142*a* is lower than the above ratio compared to the width of the lower surface 146*a*, the function of the dummy chip as a reinforcing material in the semiconductor package may be insufficient. If the width of the upper surface 142*a* to the width of the lower surface 146*a* is lower than the above ratio, the function of the dummy chip as a reinforcing material in the semiconductor package may be insufficient. If the width of the upper surface 142*a* to the width of the lower surface 146*a* exceeds the above ratio, the effect of reducing the visual variation in the appearance of the semiconductor package may be insufficient.

In addition, when the ratio of the width of the upper surface 142*a* to the width of the lower surface 146*a* is within the above range, the upper connection portion 141*a* of the dummy chip may form an angle greater than 90° and less than 180° with respect to the upper surface 142*a* of the dummy chip. For example, the upper connection portion 141*a* of the dummy chip may form an inclination angle of about 110° to about 170° with respect to the upper surface 142*a* of the dummy chip. If the angle between the upper connection portion 141*a* and the upper surface 142*a* of the dummy chip is less than the above range, since the rate at which the edge of the dummy chip 140*a* is removed increases, it may be difficult to control the coefficient of thermal expansion of the semiconductor package. If the angle between the upper connection portion 141*a* and the upper surface 142*a* of the dummy chip 140*a* exceeds the above range, the rate at which the edges of the dummy chip 140*a* are chamfered is relatively low, and thus, the effect of reducing the visual variation of the appearance of the semiconductor package may not be sufficient. FIG. 3 illustrates an example embodiment in which the edge of the dummy chip 140*a* is chamfered in the X direction, but the edge of the dummy chip 140*a* may also be chamfered in the Y direction. The inclined surfaces formed by chamfering respective edges of the dummy chip 140*a* may have the same or different inclination angles from the upper surface.

The manufacturing method of the dummy chip as illustrated in FIG. 3 is not particularly limited. For example, the upper connection portion 141*a* of the dummy chip may be formed using a v-shaped dicing blade, and the side surface 143*a* of the dummy chip may be formed by a straight dicing blade, but the present disclosure is not limited thereto.

Next, in the example embodiment of FIG. 4, an upper connection portion or transition portion 141*b* of a dummy chip 140*b* differs from the dummy chip 140 illustrated in FIGS. 2A and 2B in that the dummy chip 140*b* includes both an inclined surface CE and a curved surface RE. The curved surface RE may have a downwardly or inwardly convex shape (e.g., concave shape) as illustrated in FIG. 4, but the shape is not limited thereto. Depending on the angle of the inclined surface CE and the like, the curved surface RE may have an upwardly or outwardly convex shape. Also, referring to FIG. 4, the upper connection portion 141*b* of the dummy chip 140*b* may include the inclined surface CE connected to an upper surface 142*b* and the curved surface RE connected to a side surface 143*b*, but the configuration is not limited thereto. For example, the upper connection portion 141*b* of the dummy chip 140*b* may also include the curved surface RE connected to the upper surface 142*b* and the inclined surface CE connected to the side surface 143*b*. FIG. 4 illustrates an example embodiment in which the upper connection portion 141*b* of the dummy chip 140*b* has one inclined surface CE and one curved surface RE, but the number and position of the inclined surface CE and the curved surface RE are not limited thereto.

Next, a semiconductor package 100*c* of FIG. 5 is different from the semiconductor package 100 of FIGS. 2A and 2B in a connection method between first and second semiconductor chips 120*c* and 130*c* and a substrate. An interposer 110*c* employed in the present embodiment may include a wiring structure WS formed on or in a substrate 111*c*, and a plurality of first pads 114*c* and a plurality of second pads 113*c* disposed on first and second surfaces 110*c*A and 110*c*B of the interposer 110*c* or the substrate 111*c*, respectively, and connected by the wiring structure WS. For example, the substrate 111*c* of the interposer 110*c* may be a silicon substrate. The first and second semiconductor chips 120*c* and 130*c* may have an active surface facing toward the first surface 110*c*A of the interposer 110*c*, and an inactive surface facing away from the first surface 110*c*A of the interposer 110*c*. Connection pads 125 and 135 may be disposed on the active surfaces of the first and second semiconductor chips 120*c* and 130*c*, respectively. The first and second semiconductor chips 120*c* and 130*c* may be flip-chip bonded on the first surface 110*c*A of the interposer 110*c* through a connection terminal 116. A dummy chip 140*c* employed in this embodiment may be bonded to the first surface 110*c*A of the interposer 110*c* through the bonding layer 118. In addition, an underfill 161*c* may fill a space between the first and second semiconductor chips 120*c* and 130*c* and the first surface 110*c*A of the interposer 110*c*; in detail, the space between the connection terminals 116 connecting the connection pads 125 and 135 of the first and second semiconductor chips 120*c* and 130*c* and the first pads 114*c* of the interposer 110*c*. The underfill 161*c* may partially flow out of the first and second semiconductor chips 120*c* and 130*c* and extend along side surfaces of the first and second semiconductor chips. The underfill 161*c* may extend along a space between facing side surfaces of the first and second semiconductor chips 120*c* and 130*c* and the dummy chip 140*c*. The method of connecting the semiconductor chips and the substrate is not limited thereto, and as illustrated in FIGS. 2A to 4, bonding to the printed circuit board (PCB) through wire bonding is also possible.

In addition, as illustrated in FIG. 5, an upper connection portion or transition portion 141*c* of the dummy chip 140*c* is different from the dummy chip 140 illustrated in FIGS. 2A and 2B in that it includes first and second inclined surfaces CE1 and CE2. The first inclined surface CE1 may form a first angle with the upper surface 142*c* of the dummy chip, and the second inclined surface CE2 (or a straight line or plane extending therefrom) may form a second angle with the upper surface 142*c* of the dummy chip. The first and second angles may be greater than 90° and less than 180°. For example, the first and second angles may be in a range of about 110° or more and about 170° or less. If the first and second angles are less than the above range, since the rate at which the edges of the dummy chip 140*c* are removed increases, it may be difficult to control the thermal expansion coefficient of the semiconductor package. If the first and second angles exceed the above range, the rate at which the edges of the dummy chip 140*c* are chamfered is relatively low, and thus, the effect of reducing the visual variation of the appearance of the semiconductor package may be insufficient. As illustrated in FIG. 5, the first angle may be less than the second angle, and the upper connection portion 141*c* of the dummy chip may have a downwardly or inwardly convex (e.g., concave) shape. In another example, the first angle may be greater than the second angle, and the edge 141*c* of the dummy chip may have an upwardly or outwardly convex shape. In another example, the first angle and the second angle may be the same, and in this case, the edge 141*c* of the dummy chip may have a shape as illustrated in FIG. 3.

Figure 6:
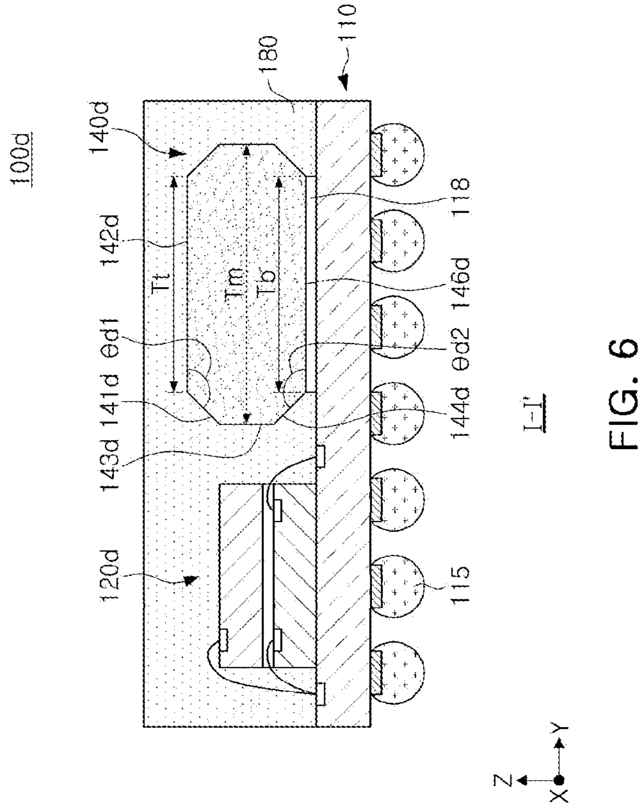
FIG. 6 is a cross-sectional view illustrating a modified example of the semiconductor package illustrated in FIGS. 2A and 2B.
Figure 7:
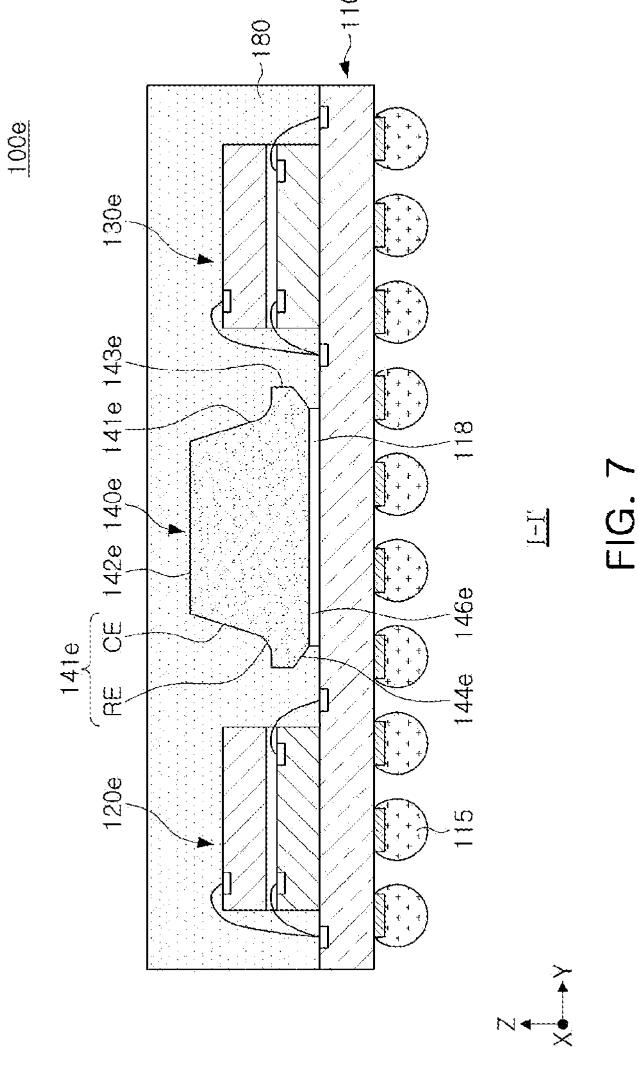
FIG. 7 is a cross-sectional view illustrating a modified example of the semiconductor package illustrated in FIGS. 2A and 2B.

FIGS. 6 and 7 are cross-sectional views illustrating modified examples of the semiconductor package. Example embodiments of FIGS. 6 and 7 are different from the above-described embodiments in the shape of the dummy chip, the arrangement of the chips, and the connection method between the chip and the substrate. For the description of the components of the example embodiments of FIGS. 6 and 7, unless otherwise specifically stated, the description of the same or similar components as those of the preceding embodiments may be applied.

Referring to FIGS. 6 and 7, the dummy chip may further include a lower connection portion between the side surface and the lower surface.

A semiconductor package 100*d* illustrated in FIG. 6 is similar to the semiconductor package 100*a* illustrated in FIG. 3 except that it further includes a lower connection portion or lower transition portion 144*d* between a side surface 143*d* and a lower surface 146*d* of a dummy chip 140*d*. Referring to FIG. 6, the dummy chip 140*d* may include an inclined surface as an upper connection portion or upper transition portion 141*d* between an upper surface 142*d* and the side surface 143*d*, and may include an inclined surface as a lower connection portion 144*d* between the side surface 143*d* and the lower surface 146*d*. Since the dummy chip 140*d* includes the upper and lower connection portions 141*d* and 144*d* formed by chamfering upper and lower edges, the reflection through the edges of the dummy chip 140*d* may be improved.

In the example embodiment of FIG. 6, a width Tt of the upper surface 142*d* and a width Tb of the lower surface 146*d* of the dummy chip may have the size of about 0.7 times to 0.95 times a maximum width Tm of the dummy chip 140*d*. If the width Tt of the upper surface 142*d* and the width Tb of the lower surface 146*d* are less than the above ratio, the function of the dummy chip as a reinforcing material in the semiconductor package may be insufficient. If the width Tt of the upper surface 142*d* and the width Tb of the lower surface 146*d* exceed the above ratio, the effect of reducing the visual variation in the appearance of the semiconductor package may be insufficient.

In addition, within the above-described range of the width Tt of the upper surface 142*d* and the width Tb of the lower surface 146*d* of the dummy chip, an upper inclination angle θd1 formed between the upper surface 142*d* and the upper connection portion 141*d* of the dummy chip and a lower inclination angle θd2 formed between the lower surface 146*d* and the lower connection portion 144*d* of the dummy chip may each have a range of about 140° to about 170°. If the inclination angles θd1 and θd2 are less than the above range, the rate at which the edges of the dummy chip 140*a* are removed increases, and thus, it may be difficult to control the thermal expansion coefficient of the semiconductor package. If the inclination angles θd1 and θd2 exceed the above range, the rate at which the edges of the dummy chip are chamfered is relatively low, and thus the effect of reducing the visual variation of the appearance of the semiconductor package may be insufficient. The upper inclination angle θd1 and the lower inclination angle θd2 may be the same as or different from each other.

Next, a semiconductor package 100*e* illustrated in FIG. 7 is different from the semiconductor package 100*b* illustrated in FIG. 4 in that it further includes an inclined surface as a lower connection portion or lower transition portion 144*e* between the side surface 143*e* and the lower surface 146*e* of a dummy chip 140*e*. For example, the dummy chip 140*e* may include an inclined surface CE and a curved surface RE as an upper connection portion 141*e* or upper transition portion, and may include an inclined surface as a lower connection portion 144*e*.

FIGS. 6 and 7 illustrate the example embodiments additionally including a configuration in which the lower edges include inclined surfaces, in the dummy chips of FIGS. 3 and 4, respectively, but the present inventive concept is not limited thereto. In the example embodiments of FIGS. 2A to 5, an inclined surface formed by chamfering the lower edge of the dummy chip or a curved surface formed by rounding the lower edge of the dummy chip may be additionally provided.

Figure 8:
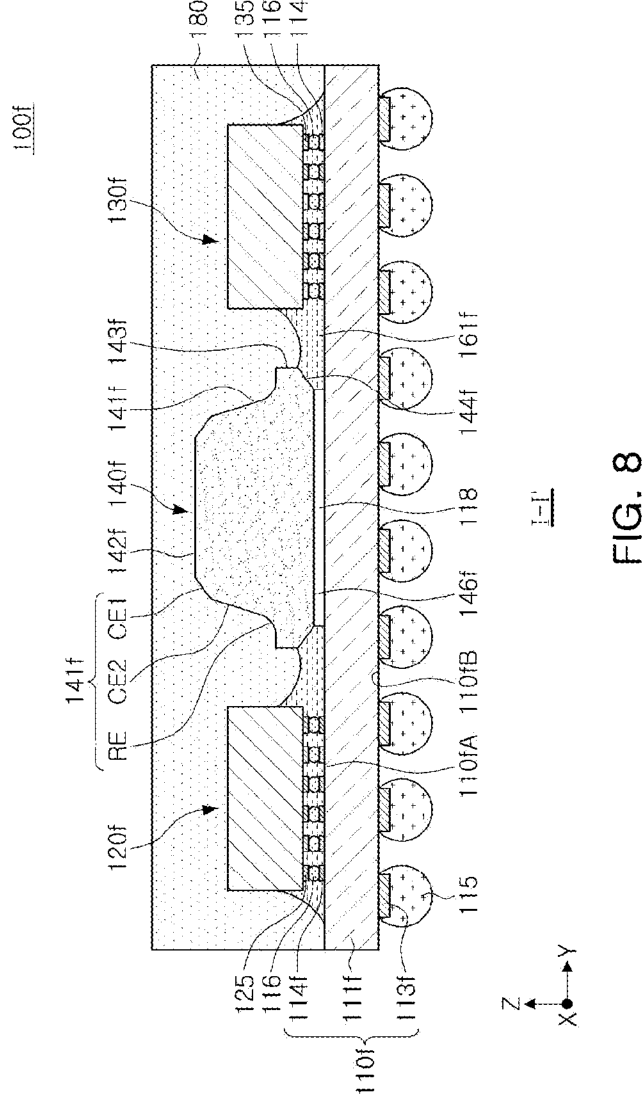
FIG. 8 is a cross-sectional view illustrating a modified example of the semiconductor package illustrated in FIGS. 2A and 2B.

In the example embodiments described with reference to FIGS. 2A to 7, the upper and lower connection portions of the dummy chip include one or two surfaces, but the configurations are not limited thereto. The upper and lower connection portions of the dummy chip may include a plurality of surfaces, and may also include both a flat surface and a curved surface. For example, as illustrated in FIG. 8, an upper connection portion or upper transition portion 141*f* of a dummy chip 140*f* of a semiconductor package 100*f* may include two inclined surfaces CE1 and CE2 and a curved surface RE. The shape, angle, curvature and the like of the surfaces constituting the upper inclined surface and the lower inclined surface of the dummy chip may be determined in consideration of the arrangement, shape, and coefficient of thermal expansion of the chip of the semiconductor package.

FIGS. 9 to 12 are cross-sectional views illustrating modified examples of the illustrated semiconductor package. Example embodiments of FIGS. 9 to 12 are different from the above-described embodiments in the shape of the dummy chip, the arrangement of the chips, and the connection method between the chip and the substrate. The description of components of the example embodiments of FIGS. 9 to 12 may refer to the descriptions of the same or similar components of the preceding embodiments, unless otherwise specified.

Figure 9:
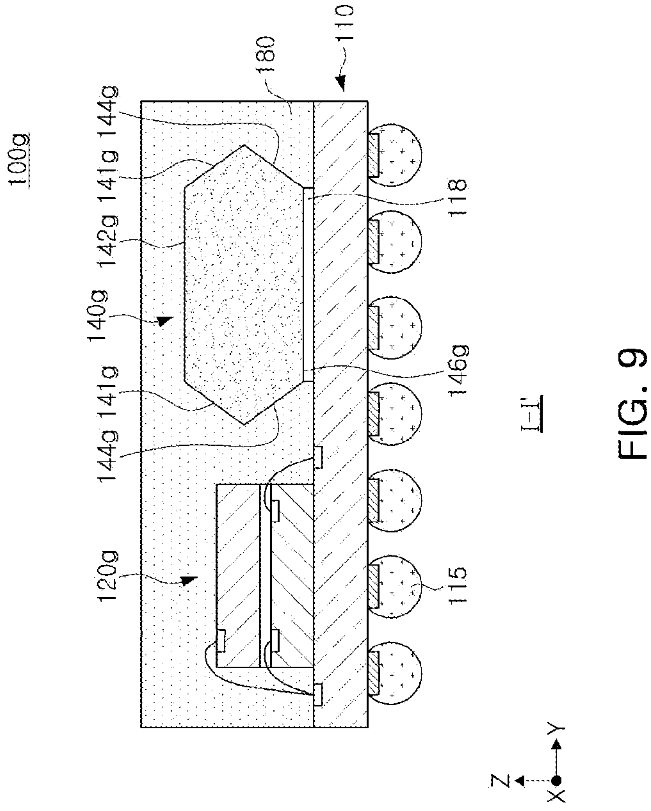
FIG. 9 is a cross-sectional view illustrating a modified example of the semiconductor package illustrated in FIGS. 2A and 2B.

In an semiconductor package 100*g* illustrated in FIG. 9, upper and lower edges of a dummy chip 140*g* may include an upper connection portion or upper transition portion 141*g* and a lower connection portion or lower transition portion 144*g* formed by chamfering. In the present embodiment, the upper connection portion 141*g* of the dummy chip may be disposed between the upper surface 142*g* and the lower connection portion or the lower inclined surface 144*g*, and the lower connection portion 144*g* may be disposed between the lower surface 146*g* and the upper connection portion or upper inclined surface 141*g*. Unlike the previous embodiments, the dummy chip 140*g* may not include a side surface perpendicular to the first surface 110*c*A (see, e.g., FIG. 2A) of the circuit board 110. The shapes and sizes of the upper inclined surface 141*g* and the lower inclined surface 144*g* may be the same or different. The inclination angle formed by the upper inclined surface 141*g* and the upper surface 142*g* and the inclination angle formed by the lower inclined surface 144*g* and the lower surface 146*g* may be the same or different.

Figure 10:
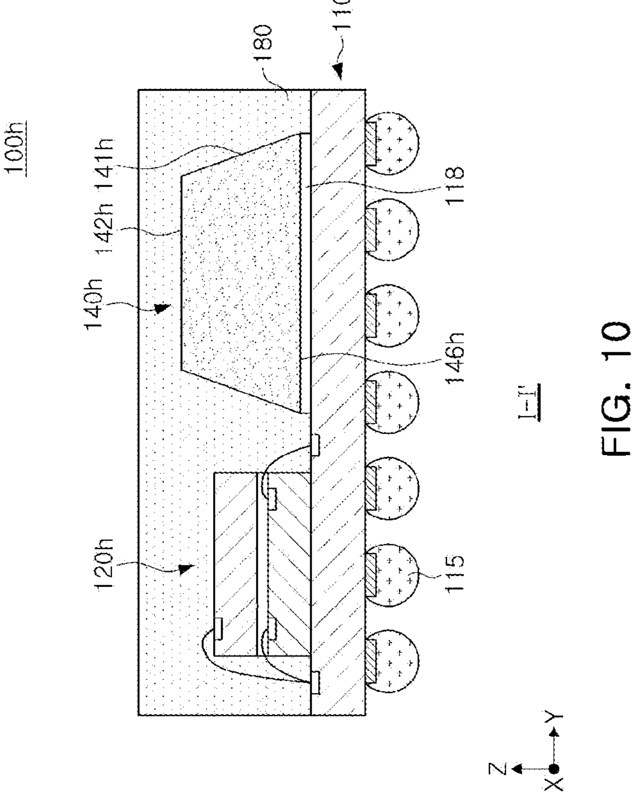
FIG. 10 is a cross-sectional view illustrating a modified example of the semiconductor package illustrated in FIGS. 2A and 2B.

Next, in the example embodiment illustrated in FIG. 10, in the case of a dummy chip 140*h*, an upper surface 142*h* and a lower surface 146*h* may be connected by a connection portion or transition portion 141*h* of an inclined surface. The dummy chip 140*h* is different from the example embodiment of FIG. 3 in that it does not include a side surface perpendicular to the first surface 110*c*A (see, e.g., FIG. 2A) of the circuit board 110. According to the size of the dummy chip, the angle at which the edges are chamfered, the position, or the like, the dummy chip may have a shape as illustrated in FIG. 3 or FIG. 10. For example, when the angle between the upper surface and the inclined surface is increased in the dummy chip illustrated in FIG. 3, the upper surface 142*h* and the lower surface 146*h* may be connected by the connection portion or inclined surface 141*h* like a dummy chip 100*h* illustrated in FIG. 10.

Figure 11:
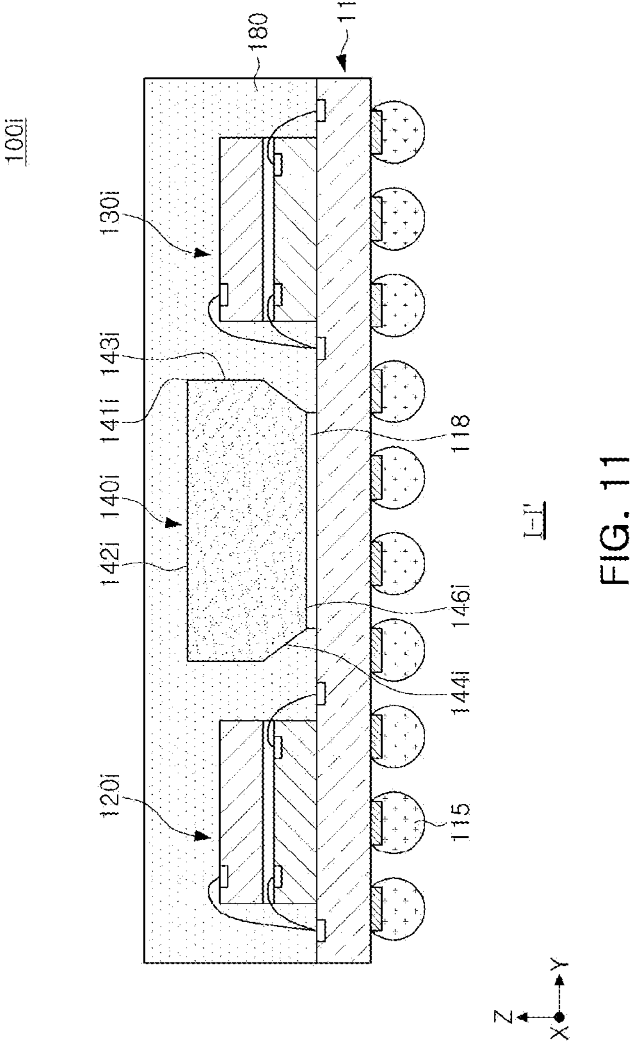
FIG. 11 is a cross-sectional view illustrating a modified example of the semiconductor package illustrated in FIGS. 2A and 2B.

Next, in an example embodiment illustrated in FIG. 11, in a dummy chip 140*i*, the upper edge may not be trimmed, and only the lower edge may be trimmed. For example, the dummy chip 140*i* may include only a lower connection portion or lower transition portion 144*i* without including the upper connection portion. In this case, in the vicinity of the upper edge of the dummy chip 140*i* adjacent to the surface of a semiconductor package 100*i*, the thickness of the dummy chip 140*i* is relatively reduced, and thus, a reflection problem of the dummy chip 140*i* appearing on the appearance of the semiconductor package 100*i* may be reduced. The inclination angle between the lower inclined surface 144*i* and a side surface 143*i* of the dummy chip may have a range of about 110° to about 170° for the same reason as described above in the example embodiment of FIG. 3.

Figure 12:
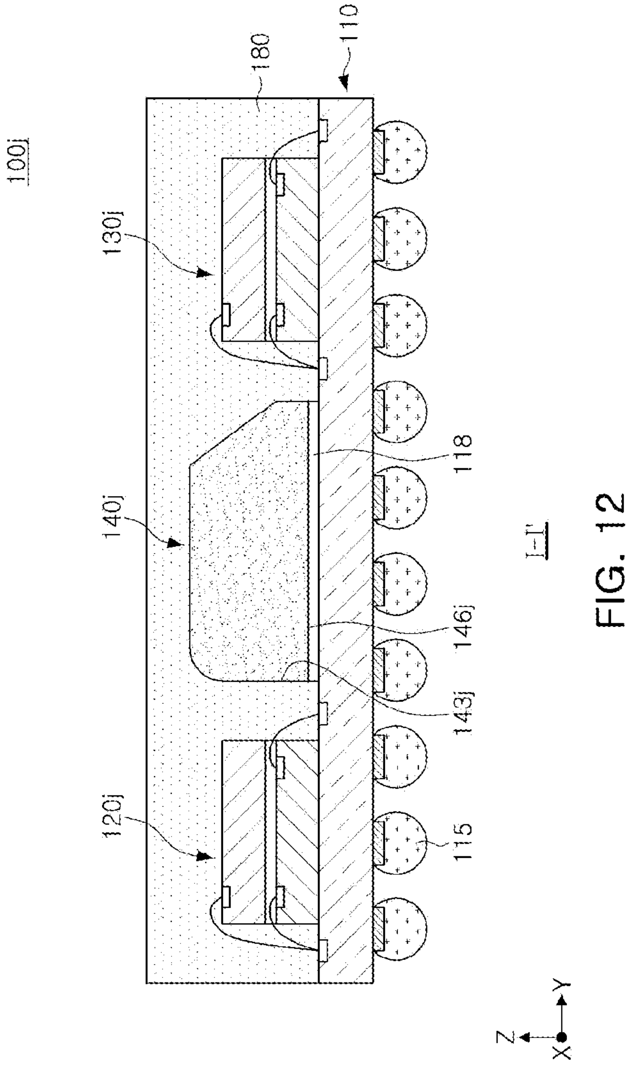
FIG. 12 is a cross-sectional view illustrating a modified example of the semiconductor package illustrated in FIGS. 2A and 2B.

In the above-described embodiments, the respective edges of the dummy chip are trimmed to have the same shape, but the present inventive concept is not limited thereto. For example, the edges of the dummy chip may be trimmed to have different shapes. For example, as illustrated in FIG. 12, one edge of a dummy chip 140*j* of a semiconductor package 100*j* may be rounded, and the other edge may be chamfered.

Figure 13:
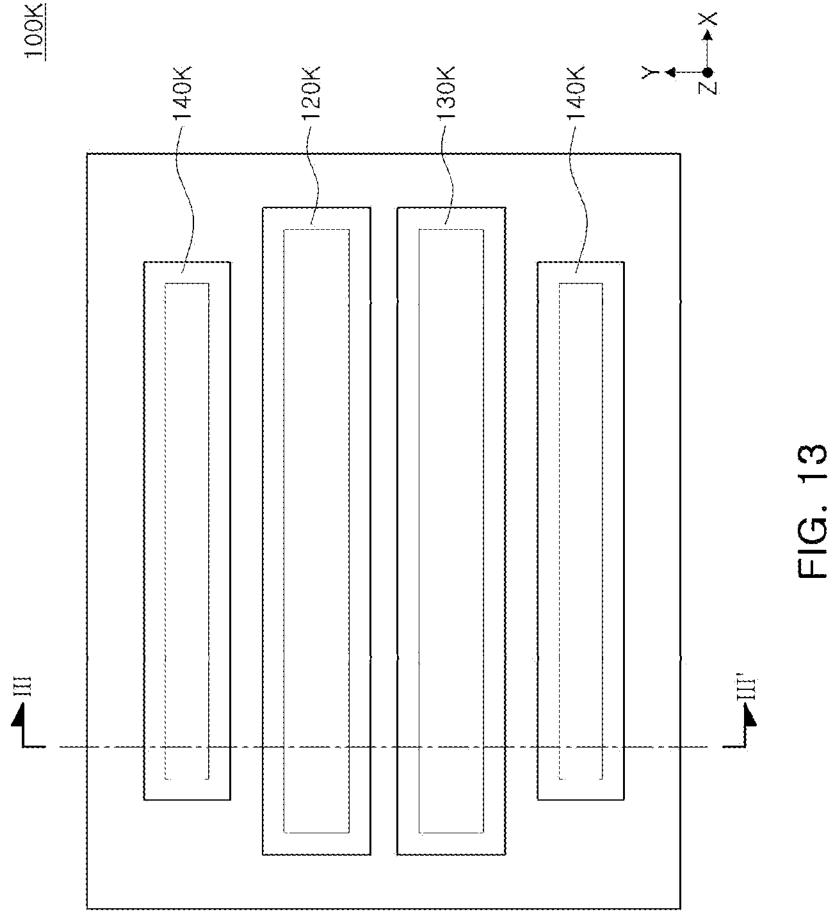
FIG. 13 is a plan view illustrating a modified example of the semiconductor package of FIG. 1.
Figure 14:
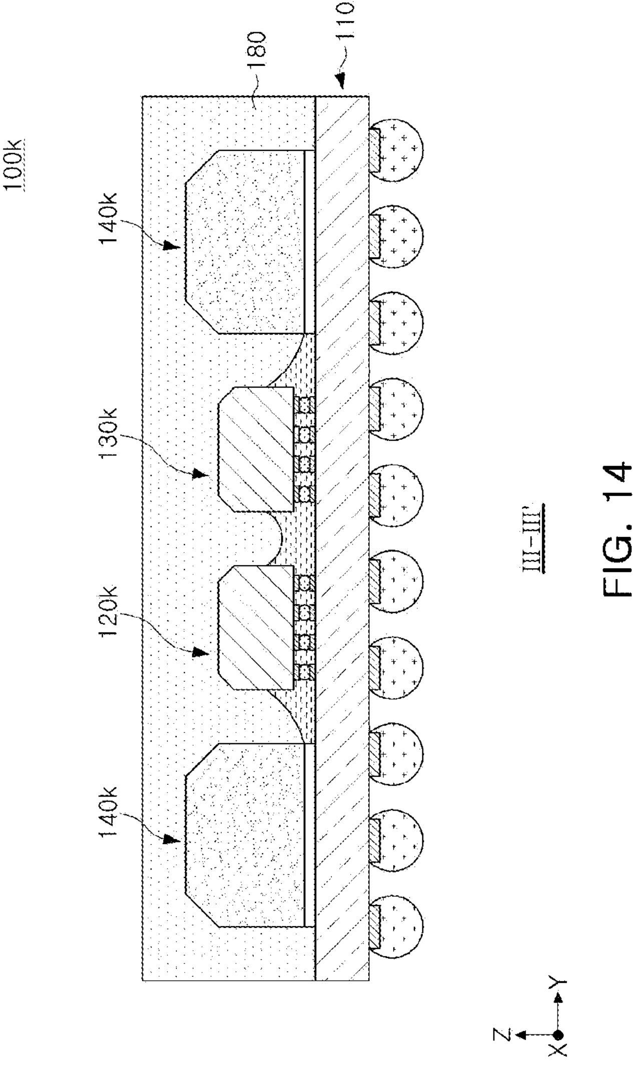
FIG. 14 is a cross-sectional view of the semiconductor package of FIG. 13 taken along line III-III'.

Next, FIG. 13 is a plan view illustrating a modified example of the semiconductor package of FIG. 1, and FIG. 14 is a cross-sectional view of the semiconductor package of FIG. 13 taken along line III-III'.

As illustrated in FIG. 13, dummy chips 140*k* may be disposed on both sides of a semiconductor package 100*k*, respectively, and first and second semiconductor chips 120*k* and 130*k* may be disposed between the dummy chips 140*k*. The number, arrangement, shape, and the like of the chips are not limited thereto, and the above-described edge treatment of chips may be applied to various semiconductor packages.

FIG. 14 is a cross-sectional view of the semiconductor package of FIG. 13 taken along line III-III'. As illustrated in FIG. 14, the semiconductor package 100*k* may include not only the dummy chips 140*k* with trimmed edges, but also first and second semiconductor chips 120*k* and 130*k* with trimmed edges. The above-described edge treatment of the dummy chip is also applicable to the edge of the semiconductor chip. For example, the edges between the inactive surfaces (upper surfaces) and the side surfaces of the first and second semiconductor chips 120*k* and 130*k* are trimmed in the horizontal direction (X-Y directions), and thus, may have chamfered inclined surfaces as illustrated in FIG. 14. Referring to FIG. 14, in the example embodiment in which the edges of the first and second semiconductor chips 120*k* and 130*k* are chamfered, the first and second semiconductor chips 120*k* and 130*k* may have relatively high mounting heights, and even in this case, the problem of visual variation due to the reflection of the chip on the appearance of the semiconductor package does not occur.

As set forth above, according to an example embodiment, a semiconductor device having an improved appearance through edge trim of a chip may be provided.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a circuit board including a wiring structure;

first and second semiconductor chips on the circuit board and connected to the wiring structure;

a dummy chip on the circuit board, positioned between the first and second semiconductor chips, and having a rounded edge between an upper surface and a side surface thereof; and a molded member on the circuit board and surrounding the first and second semiconductor chips and the dummy chip and covering upper surfaces of the first and second semiconductor chips and the upper surface of the dummy chip, wherein the dummy chip is free of through vias extending therethrough, wherein a vertical spacing between the upper surface of the dummy chip and an upper surface of the molded member is less than a vertical spacing between the upper surfaces of the first and second semiconductor chips and the upper surface of the molded member, wherein the dummy chip is directly bonded to the circuit board by a bonding layer, wherein the bonding layer is formed of a non-conductive material, and wherein a width of the upper surface of the dummy chip is smaller than a width of a lower surface of the dummy chip.

2. The semiconductor package of claim 1, wherein a radius of curvature of the rounded edge of the dummy chip is about 15 μm to about 90 μm.

3. The semiconductor package of claim 1, wherein the rounded edge of the dummy chip comprises a convex surface.

4. The semiconductor package of claim 1, wherein a mounting height of the dummy chip is about 160 μm to about 180 μm, and a mounting height of the first and second semiconductor chips is about 150 μm to about 170 μm.

5. The semiconductor package of claim 1, wherein a mounting height of the dummy chip is about 1.05 times to about 1.30 times a mounting height of the first and second semiconductor chips.

6. The semiconductor package of claim 1, wherein the side surface of the dummy chip includes a plane perpendicular to an upper surface of the circuit board.

7. The semiconductor package of claim 1, wherein the first and second semiconductor chips are electrically connected to the wiring structure of the circuit board by a plurality of bonding wires.

8. The semiconductor package of claim 1, wherein a thermal expansion coefficient of the dummy chip is less than a thermal expansion coefficient of the molded member.

9. The semiconductor package of claim 1, wherein the side surface of the dummy chip is coplanar with a side surface of the bonding layer.

* * * * *